US009028982B2

(12) United States Patent
Yae et al.

(10) Patent No.: US 9,028,982 B2
(45) Date of Patent: May 12, 2015

(54) COMPOSITE MATERIAL, METHOD FOR PRODUCING THE SAME, AND APPARATUS FOR PRODUCING THE SAME

(75) Inventors: Shinji Yae, Akashi (JP); Tatsuya Hirano, Himeji (JP); Hitoshi Matsuda, Himeji (JP)

(73) Assignee: Japan Science and Technology Agency, Saitama (JP)

( * ) Notice: Subject to any disclaimer, the term of this patent is extended or adjusted under 35 U.S.C. 154(b) by 721 days.

(21) Appl. No.: 12/991,902

(22) PCT Filed: Mar. 2, 2009

(86) PCT No.: PCT/JP2009/053871
§ 371 (c)(1),
(2), (4) Date: Feb. 3, 2011

(87) PCT Pub. No.: WO2010/021166
PCT Pub. Date: Feb. 25, 2010

(65) Prior Publication Data
US 2011/0123813 A1    May 26, 2011

(30) Foreign Application Priority Data
Aug. 19, 2008   (JP) ................................ 2008-211184

(51) Int. Cl.
*B32B 9/00*   (2006.01)
*B32B 19/00*   (2006.01)
(Continued)

(52) U.S. Cl.
CPC ...... *H01L 21/02697* (2013.01); *C23C 18/1651* (2013.01); *C23C 18/1658* (2013.01); *C23C 18/44* (2013.01); *C23C 18/54* (2013.01); *Y10S 977/721* (2013.01); *Y10S 977/779* (2013.01)

(58) Field of Classification Search
CPC .... C01B 33/02; C23C 18/08; C23C 18/1639; C23C 18/1642; C23C 18/1651; C23C 18/1658; C23C 18/42; C23C 18/44
USPC .................. 428/446, 450, 699; 977/721, 779
See application file for complete search history.

(56) References Cited

U.S. PATENT DOCUMENTS

| 4,376,963 A | 3/1983 | Knoop et al. ................. 360/135 |
| 5,591,565 A | 1/1997 | Holdermann et al. ........ 430/314 |

(Continued)

FOREIGN PATENT DOCUMENTS

| JP | 57-105826 A | 1/1982 |
| JP | 60-004271 A | 1/1985 |

(Continued)

OTHER PUBLICATIONS

Yae et al., "Metal Nanorod Production in Silicon Matrix by Electroless Process", Applied Surface Science, vol. 255, 2009, pp. 4670-4672.*

(Continued)

*Primary Examiner* — Jonathan Langman
(74) *Attorney, Agent, or Firm* — Seed IP Law Group, PLLC

(57) ABSTRACT

Disclosed is a composite material wherein adhesion between a silicon surface and a plating material is enhanced. A method and an apparatus for producing the composite material are also disclosed. The method for producing a composite material comprises a dispersion/allocation step wherein the surface of a silicon substrate (102), which is a matrix provided with a silicon layer at least as the outermost layer, is immersed into a first solution containing gold (Au) ions, so that particulate or island-shaped gold (Au) serving as a first metal and substituted with a part of the silicon layer are dispersed/allocated on the matrix surface, and a plating step wherein the silicon substrate (102) is immersed into a second solution (24), which contains a reducing agent to which gold (Au) exhibits catalyst activity and metal ions which can be reduced by the reducing agent, so that the surface of the silicon substrate (102) is covered with the metal or an alloy of the metal (108) which is formed by autocatalytic electroless plating using gold (Au) as a starting point.

10 Claims, 11 Drawing Sheets

(51) Int. Cl.
| | |
|---|---|
| B32B 9/04 | (2006.01) |
| B32B 9/06 | (2006.01) |
| H01L 21/02 | (2006.01) |
| C23C 18/16 | (2006.01) |
| C23C 18/44 | (2006.01) |
| C23C 18/54 | (2006.01) |

(56) References Cited

U.S. PATENT DOCUMENTS

| | | | |
|---|---|---|---|
| 6,750,111 | B2 | 6/2004 | Schrems |
| 7,183,012 | B2 | 2/2007 | Saito et al. ............... 428/831.2 |
| 7,718,254 | B2 | 5/2010 | Matsumura et al. |
| 7,968,462 | B1 | 6/2011 | Sun et al. |
| 2003/0186084 | A1 | 10/2003 | Saito et al. ............... 428/694 R |
| 2004/0187975 | A1 | 9/2004 | Suemasu et al. |
| 2005/0062033 | A1 | 3/2005 | Ichihara et al. |
| 2005/0101153 | A1 | 5/2005 | Matsumura et al. .......... 438/753 |
| 2006/0292294 | A1 | 12/2006 | Klein et al. |
| 2007/0232044 | A1 | 10/2007 | Chowdhury et al. |
| 2008/0090074 | A1 | 4/2008 | Matsumura et al. .......... 428/338 |
| 2009/0156426 | A1 | 6/2009 | Schiestel et al. ............... 506/11 |
| 2011/0117373 | A1 | 5/2011 | Yae et al. |
| 2011/0123813 | A1 | 5/2011 | Yae et al. |
| 2011/0151242 | A1 | 6/2011 | Yae et al. |
| 2012/0321798 | A1 | 12/2012 | Yae et al. |

FOREIGN PATENT DOCUMENTS

| | | |
|---|---|---|
| JP | 06-029246 A | 2/1994 |
| JP | 11-283829 A | 10/1999 |
| JP | 2001-115268 A | 4/2001 |
| JP | 2003-288712 A | 10/2003 |
| JP | 2004-071626 A | 3/2004 |
| JP | 2004-124235 | 4/2004 |
| JP | 2004-193337 A | 7/2004 |
| JP | 2004-237429 A | 8/2004 |
| JP | 2005-105409 A | 4/2005 |
| JP | 2005-139376 A | 6/2005 |
| JP | 2006-342402 A | 12/2006 |
| JP | 2007-119897 A | 5/2007 |
| JP | 2007-533983 A | 11/2007 |
| WO | WO 2005/105308 A1 | 11/2005 |
| WO | 2006/051727 | 5/2006 |
| WO | WO 2009/110428 A1 | 9/2009 |
| WO | WO 2009/110431 A1 | 9/2009 |
| WO | WO 2010/021166 A1 | 2/2010 |

OTHER PUBLICATIONS

Zschech et al., "High-Temperature resistant, ordered gold nanoparticle arrays", Nanotechnology, vol. 17, 2006, pp. 2122-2126.*
Zhang et al.. "Selective Electroless Deposition of Cu on an Ultrathin Au Film pattern", Macromolecular Rapid Communications, vol. 25, 2004, pp. 1917-1925.*
Atsushiba et al. "Adhesion and Interfacial Structure of Metal Film Electrolessly Deposited on Si Using Au Nanoparticles as Catalysts", 225th CS meeting, May 12, 2014, 3 pages.*
U.S. Appl. No. 13/875,198, filed May 1, 2013.
U.S. Appl. No. 14/019,299, filed Sep. 5, 2013.
U.S. Office Action, issued Sep. 16, 2013, for U.S. Appl. No. 13/589,793, 22 pages.
Office Action, dated Aug. 28, 2013, for corresponding Japanese Application No. 200980107159.0, 13 pages, (with English Translation).
Japanese Patent Application No. 2010-501898, Japanese Office Action, Feb. 8, 2013 (with translation).
U.S. Appl. No. 12/920,638, Final Office Action, Jan. 24, 2013.
Notice of Written Opinion on the First Examination, issued May 14, 2012, for Application No. 200980126613.7, 3 pages.
Translation of Notice of Written Opinion on the First Examination, issued Jun. 14, 2012, for Application No. 200980126613.7, 3 pages.
Communication pursuant to Rules 70(2) and 70a(2) EPC, for corresponding European Patent Application No. 09717775.2, dated Oct. 25, 2011, 1 page.
Asoh et al., "Effect of noble metal catalyst species on the morphology of macroporous silicon formed by metal assisted chemical etching," *Electrochimica Acta* 54:5142-5148, 2009.
Hirano et al., "Electroless Process for Producing Metal Filled Si Nanopores," ECS Meeting Abstracts MA Feb. 2008 134, 214th ECS Meeting 2008, 1 page.
Yae et al., "Composite Material, Method of Producing the Same, and Apparatus for Producing the Same," U.S. Appl. No. 13/875,198, filed May 1, 2013, 50 pages.
Japanese Office Action for Japanese Application No. 2008-054506, dated Apr. 23, 2013, 2 pages.
English Translation of Japanese Office Action for Japanese Application No. 2008-054506, dated Apr. 23, 2013, 2 pages.
Kanungo et al., "Improved contacts on a porous silicon layer by electroless nickel plating and copper thickening," *Semicond. Sci. Technol.* 21:964-970, 2006.
Tsujino et al., "Helical Nanoholes Bored in Silicon by Wet Chemical Etching Using Platinum Nanoparticles as Catalyst," *Electrochemical and Solid-State Letters* 8(12):C193-C195, 2005.
U.S. Office Action, issued Sep. 5, 2012, for U.S. Appl. No. 12/920,638, 10 pages.
Korean Office Action for Korean Application No. 10-2010-7022171, issued Jun. 8, 2012, 3 pages.
English translation of Korean Office Action for Korean Application No. 10-2010-7022171, mailed Jun. 8, 2012, 4 pages.
Chinese Notification of Written Opinion on the First Examination, dated Feb. 21, 2012, for Chinese Application No. 200980107159.0, 8 pages.
English Translation of Chinese Notification of Written Opinion on the First Examination, dated Feb. 21, 2012, for Chinese Patent Application No. 200980107159.0, 8 pages.
Ito et al., Nanohole Patterned Media, *Fujitsu* 58(1):90-98, Jan. 2007.
Tsujino et al, "Morphology of nanoholes formed in silicon by wet etching in solutions containing HF and $H_2O_2$ at different concentrations using silver nanoparticles as catalysts," *Electrochemica Acta* 53:28-34, 2007.
Yae et al., "Formation of porous silicon by metal particle enhanced chemical etching in HF solution and its application for efficient solar cells," *Electrochemistry Communications* 5:632-636, 2003.
Japanese Office Action, dated Mar. 25, 2014, for Japanese Application No. 2013-068723, 2 pages.
English Translation of Japanese Office Action, dated Mar. 25, 2014, for Japanese Application No. 2013-068723, 2 pages.
Zschech et al., "High-temperature resistant, ordered gold nanoparticle arrays," *Nanotechnology* 17:2122-2126, 2006.
Peng et al., "Uniform, Axial-Orientation Alignment of One-Dimensional Single-Crystal Silicon Nanostructure Arrays," *Angew. Chem. Int. Ed* 44:2737-2742, 2005.
Peng et al., "Fabrication of Single-Crystalline Silicon Nanowires by Scratching a Silicon Surface with Catalytic Metal Particles," *Adv. Funct. Mater.* 16:387-394, 2006.
Sun et al., "Noble Metal Activation Layer," U.S. Appl. No. 61/017,490, filed Dec. 28, 2007, 30 pages.

* cited by examiner

COMPOSITE MATERIAL, METHOD FOR PRODUCING THE SAME, AND APPARATUS FOR PRODUCING THE SAME

TECHNICAL FIELD

The present invention relates to a composite material, a method for producing the same, and an apparatus for producing the same.

BACKGROUND ART

There have been conventionally studied surface treatment methods such as metal coating, nonmetal coating, and chemical conversion coating. So far, variously functional composite materials have been created using a matrix of a metal provided on a surface thereof with a film of another metal.

Plating is one of typical examples of the several surface treatment methods. This plating technique is widely adopted in various industries. However, such a layer of a metal or the like to be formed by plating described above is not sufficiently adhesive to a matrix thereof unless the matrix is appropriately selected. For example, silicon, which is most widely used in the fields of semiconductor, MEMS, and the like, is one of the matrices to be provided with a metal layer by plating. However, as having been pointed out, silicon generally has poor adhesion with a plated metal (Patent Document 1, for example).

As one of techniques for improving adhesion of a metal layer to silicon, there is disclosed a method of immersing a surface of polycrystalline silicon in a heated aqueous solution of sodium hydroxide (NaOH) to provide unevennesses in order to improve adhesion between the surface and a plated metal layer (see Patent Document 2). Also disclosed is a technique of forming a porous layer with use of a special substrate and filling pores in the porous layer with a plating material by displacement plating (Patent Document 3).

Non-Patent Document 1: K. Ito and one other, "Nanohole Patterned Media", Journal FUJITSU, Fujitsu Limited, January 2007, Vol. 58, No. 1, pp. 90-98
Non-Patent Document 2: S. Yae and four others, "Electrochemistry Communications", August 2003, Vol. 5, p. 632
Non-Patent Document 3: K. Tsujino and one other, "Electrochemica Acta", Nov. 20, 2007, Vol. 53, p. 28
Patent Document 1: Japanese Unexamined Patent Publication No. 2004-193337
Patent Document 2: Japanese Unexamined Patent Publication No. S60-4271
Patent Document 3: Japanese Unexamined Patent Publication No. 2006-342402
Patent Document 4: Japanese Unexamined Patent Publication No. S57-105826
Patent Document 5: Japanese Unexamined Patent Publication No. H11-283829
Patent Document 6: Japanese Unexamined Patent Publication No. 2003-288712
Patent Document 7: Japanese Unexamined Patent Publication No. 2004-237429
Patent Document 8: Japanese Unexamined Patent Publication No. 2005-139376
Patent Document 9: Japanese Unexamined Patent Publication No. 2007-533983
Patent Document 10: United States Unexamined Patent Publication No. 2005/0101153

DISCLOSURE OF THE INVENTION

Problems to be Solved by the Invention

As described above, there have been disclosed several techniques of forming a metal film on a silicon surface by plating. However, in such a case where a metal film or the like is formed entirely on a silicon surface by plating, insufficient filling of the unevennesses causes voids, which may deteriorate the adhesion as well as inhibit exertion of the functions of the composite material.

Further, for example, upon adoption of widely used electroplating, it is necessary to provide a power supply and electrodes, resulting in limited achievements of decrease in size of equipment and reduction in cost for the equipment. On the other hand, it is required to go through complex production steps in the technique of filling pores by conventional electroless plating.

In order to solve the various problems described above, the present inventors have proposed in Japanese Patent Application No. 2008-57865 a method for producing a composite material that has improved adhesion of a plating material to a silicon surface. More specifically, the inventors have proposed a method for producing a composite material in which pores formed in a silicon surface layer are filled up with a plating material by autocatalytic electroless plating with bottoms of the pores serving as starting points as well as the plating subsequently progresses even onto the silicon surface provided with no pores.

However, even with the above invention made by the present inventors which provides a composite material exerting a high adhesibility, there are still possibilities of simplification in the production steps as well as improvements of efficiency and stability thereof. Moreover, it will be a significant progress in the technique to obtain a composite material exerting high adhesion even with use of a matrix having a substantially flat surface roughness, since it is possible to provide a production method and a structure which have extremely small influence on the matrix in the thickness direction thereof.

Solutions to the Problems

The present invention solves the technical problems described above to remarkably contribute to further improvement in productivity of a composite material that exerts a high adhesibility. The inventors continued, after the above proposal, their studies on a composite material exerting excellent adhesion. They finally found that it is possible to obtain a composite material exerting a high adhesibility by utilizing a surface of a silicon layer on which a predetermined metal is dispersed and allocated into shapes of particles or islands even in a case where there are provided substantially no pores in the silicon surface layer. Such pores had been regarded as essential for keeping high adhesion. The present invention was thus made on the basis of the above finding.

A method for producing a composite material according to the present invention includes: a dispersion/allocation step of dispersing and allocating, on a surface of a matrix that has a silicon layer formed at least as an uppermost layer, gold (Au) into shapes of particles or islands, the gold (Au) being displaced by part of the silicon layer by immersing the surface of the matrix in a first solution including ions of the gold (Au); and a plating step of covering the surface of the matrix with a metal or an alloy of the metal, which is formed by autocatalytic electroless plating with the gold (Au) serving as starting points, by immersing the matrix in a second solution including a reducing agent to which the gold (Au) is catalytically active and ions of the metal to be reduced by the reducing agent.

In this method for producing a composite material, the matrix is initially provided on the silicon layer thereof with gold that is displaced by part of the silicon layer and is dispersed and allocated into the shapes of particles or islands. The matrix is then provided on the silicon layer thereof with the metal or an alloy of the metal (hereinafter in this paragraph, referred to as a specific metal or the like) by autocatalytic electroless plating. The metal is possibly reduced by the reducing agent to which gold being dispersed and allocated is catalytically active. Accordingly, even after gold (Au) is covered with the specific metal or the like, this specific metal or the like serves as a catalytic agent and continuously stimulates reduction of the ions of the specific metal or the like. As a result, the specific metal or the like is formed to cover the surface of the matrix with gold displaced by part of the silicon layer serving as the starting points, regardless of unevennesses on the surface of the initial silicon layer. In other words, there is no need to essentially provide or control the unevennesses in order to form the specific metal or the like, which results in stabilization of the production steps. Moreover, the layer of the specific metal or the like is found to have significantly high adhesion to the silicon layer of the matrix, although the reason therefor has not yet been specified at the present stage.

A composite material according to the present invention includes: a matrix having a silicon layer formed at least as an uppermost layer; gold (Au) allocated on a surface of the matrix into shapes of particles or islands by being displaced by part of the silicon layer; and a metal or an alloy of the metal covering the surface of the matrix, the metal or the alloy of the metal being formed by autocatalytic electroless plating with the gold (Au) serving as starting points and being catalytically active.

In this composite material, the silicon layer of the matrix is covered with the metal or an alloy of the metal (hereinafter in this paragraph, referred to as a specific metal or the like). The metal is possibly reduced by the reducing agent to which gold in the shapes of particles or islands displaced by part of the silicon layer of the matrix is catalytically active. As a result, the specific metal or the like is not affected by unevennesses on the surface of the initial silicon layer. The layer of the specific metal or the like is found to have significantly high adhesion to the silicon layer of the matrix, although the reason therefor has not yet been specified at the present stage.

An apparatus for producing a composite material according to the present invention includes: a dispersion/allocation device for dispersing and allocating, on a surface of a matrix that has a silicon layer formed at least as an uppermost layer, gold (Au) into shapes of particles or islands, the gold (Au) being displaced by part of the silicon layer by immersing the surface of the matrix in a first solution including ions of the gold (Au); and a plating device for covering the surface of the matrix with a metal or an alloy of the metal, which is formed by autocatalytic electroless plating with the gold (Au) serving as starting points, by immersing the matrix in a second solution including a reducing agent to which the gold (Au) is catalytically active and ions of the metal to be reduced by the reducing agent.

In this apparatus for producing a composite material, the dispersion/allocation device disperses and allocates into the shapes of particles or islands, on the silicon layer of the matrix, gold that is displaced by part of the silicon layer. Furthermore, the plating device forms on the silicon layer of the matrix the metal or an alloy of the metal (hereinafter in this paragraph, referred to as a specific metal or the like) by autocatalytic electroless plating. The metal is possibly reduced by the reducing agent to which gold being dispersed and allocated is catalytically active. Accordingly, even after gold (Au) is covered with the specific metal or the like, this specific metal or the like serves as a catalytic agent and continuously stimulates reduction of the ions of the specific metal or the like. As a result, the specific metal or the like is formed to cover the surface of the matrix with gold displaced by part of the silicon layer serving as the starting points, regardless of unevennesses on the surface of the initial silicon layer. The layer of the specific metal or the like is found to have significantly high adhesion to the silicon layer of the matrix, although the reason therefor has not yet been specified at the present stage.

In the present invention, the expression "displaced by part of the silicon layer" does not indicate that gold (Au) is displaced and allocated into the shapes of particles or islands in a region completely identical with the region of the displaced silicon layer. Rather, this expression "displaced by part of the silicon layer" indicates that gold (Au) is displaced and allocated into the shapes of particles or islands in the vicinity of the region of the displaced silicon layer.

Effects of the Invention

In a method for producing a composite material according to the present invention, the matrix is provided on the silicon layer thereof with the metal or an alloy of the metal (hereinafter in this paragraph, referred to as a specific metal or the like) by autocatalytic electroless plating. The metal is possibly reduced by a reducing agent to which gold being dispersed and allocated on the silicon layer is catalytically active. As a result, the specific metal or the like is formed to cover the surface of the silicon layer of the matrix with gold serving as starting points, while keeping high adhesion to the silicon layer thereof regardless of unevennesses on the surface of the initial silicon layer.

In a composite material according to the present invention, the silicon layer of the matrix is covered with the metal or an alloy of the metal that is possibly reduced by a reducing agent to which gold being displaced by part of the silicon layer of the matrix and having the shapes of particles or islands is catalytically active. As a result, the metal or an alloy of the metal is not affected by unevennesses on the surface of the initial silicon layer. Furthermore, the layer of the specific metal or the like has significantly high adhesion to the silicon layer of the matrix.

In an apparatus for producing a composite material according to the present invention, the matrix is provided on the silicon layer thereof with the metal or an alloy of the metal (hereinafter in this paragraph, referred to as a specific metal or the like) by autocatalytic electroless plating. The metal is possibly reduced by a reducing agent to which gold being dispersed and allocated on the silicon layer is catalytically active. As a result, the specific metal or the like is formed to cover the surface of the silicon layer of the matrix with gold serving as starting points, while keeping high adhesion to the silicon layer thereof regardless of unevennesses on the surface of the initial silicon layer.

BEST MODES FOR CARRYING OUT THE INVENTION

Figure 1:
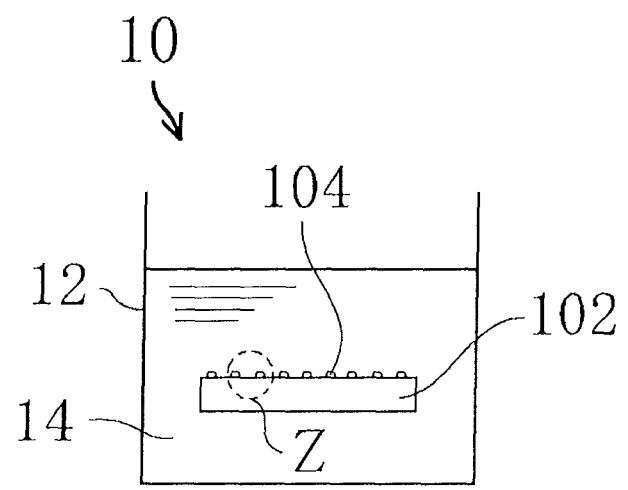
FIG. 1 is a diagram illustrating a dispersion/allocation device for dispersing and allocating a first metal into shapes of particles or islands, according to an embodiment of the present invention.

Embodiments of the present invention are described in detail with reference to the accompanying drawings. In the description, common parts are denoted by common reference symbols in all the drawings unless otherwise specified. Further, the elements in these embodiments are not necessarily illustrated in accordance with the same scale in the drawings. Some of the symbols may not be indicated in the drawings for the purpose of simplification in the appearances thereof.
<First Embodiment>

Figure 2A:
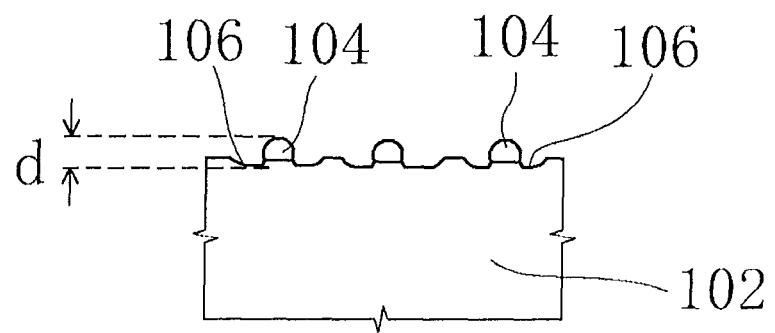
FIG. 2A is an enlarged view (pattern diagram) of part (a Z portion) in FIG. 1.
Figure 2B:
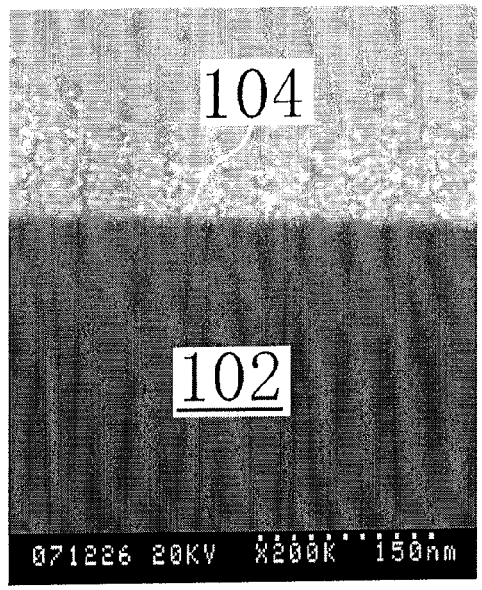
FIG. 2B is a cross sectional SEM picture of a single-crystalline silicon substrate with the first metal being dispersed and allocated, as an example of FIG. 2A.
Figure 3:
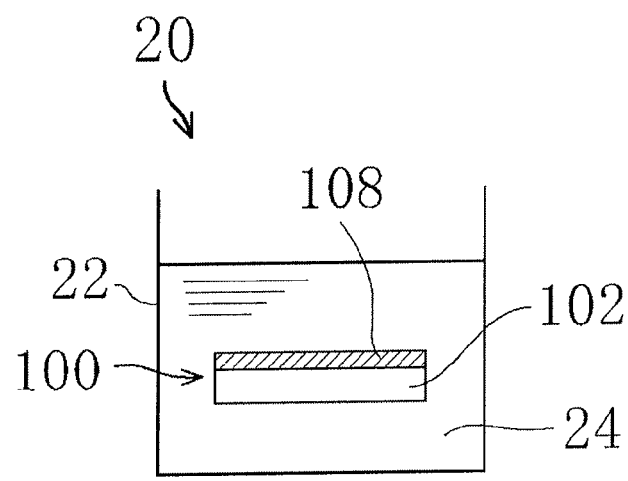
FIG. 3 is a diagram illustrating a plating device for plating a second metal or an alloy of the second metal on the single-crystalline silicon substrate according to the embodiment of the present invention.

Described in the present embodiment are a composite material 100 and a method for producing the same. FIG. 1 is a diagram illustrating a dispersion/allocation device 10 for dispersing and allocating on a matrix a first metal into shapes of particles or islands according to the present embodiment. FIG. 2A is an enlarged view of part of (a Z portion of) a surface of the matrix in FIG. 1. FIG. 2B is a scanning electron microscope (hereinafter, referred to as a SEM) picture showing a cross section of the matrix, as an example of FIG. 2A. FIG. 3 is a diagram illustrating a plating device 20 for providing on the surface of the matrix a film or a layer (hereinafter, selectively referred to as a "layer" for the purpose of simplification in the description) of a second metal or an alloy of the second metal. The matrix in the present embodiment is referred to as a silicon substrate 102, which initially has a root-mean-square roughness (Rq) equal to 0.2 nm. The present embodiment adopts gold (Au) as the first metal and a nickel-phosphorus alloy (Ni—P) as the second metal or an alloy of the second metal.

Figure 4:
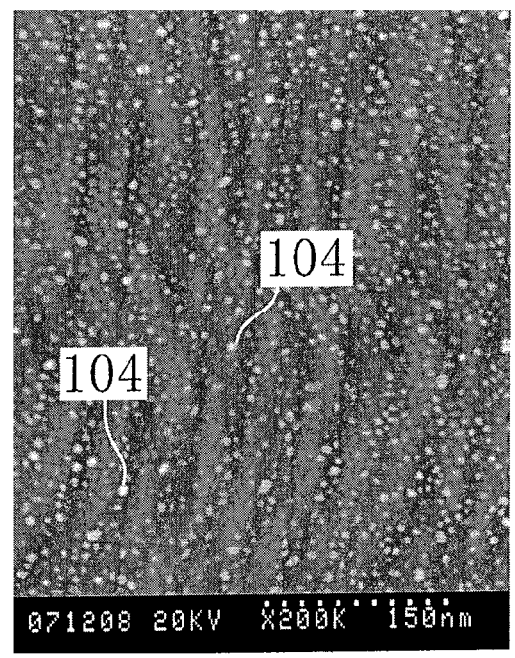
FIG. 4 is a SEM picture showing in a plan view the state where the first metal is dispersed and allocated on the single-crystalline silicon substrate according to the embodiment of the present invention.

As shown in FIG. 1, in the present embodiment, the silicon substrate 102 as the matrix is initially immersed for 10 seconds in an aqueous solution (hereinafter, also referred to as a first solution) 14 that is contained in a liquid tank 12 and is preliminarily conditioned to 5° C. This aqueous solution 14 includes tetrachloroauric acid ($HAuCl_4$) of a molarity equal to 1 mmol/L (millimole/liter) and hydrofluoric acid (HF) of a molarity equal to 150 mmol/L. Observed as a result was that particles of gold (Au) as a first metal 104 of diameters from 4 nm to 15 nm were deposited substantially uniformly on the surface of the silicon substrate 102 at a particle density of approximately $5.5 \times 10^{11}$ particles/$cm^2$. FIG. 4 is a SEM picture showing the state in a plan view of the surface of the silicon substrate 102. The silicon substrate 102 in the present embodiment was a single-crystalline silicon substrate of a p-type. Although not illustrated in the figure for the purpose of simplification in the appearance thereof, the silicon substrate 102 is immersed while being partially covered with and retained by a holder that is made of a known fluorocarbon resin. Such a holder for the silicon substrate 102 is not shown either in FIG. 3 to be referred to later.

Figure 2C:
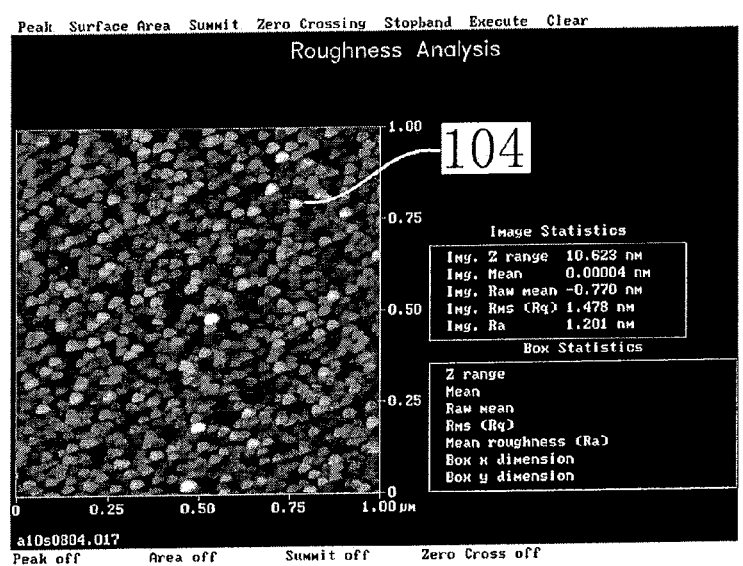
FIG. 2C is an AFM image showing the state where the first metal is dispersed and allocated on the single-crystalline silicon substrate according to the embodiment of the present invention.

As shown in FIGS. 2A and 2B, gold (Au) is dispersed and allocated into the shapes of particles or islands by displacement plating of being displaced by part of the silicon layer. When closely observing the surface of the silicon substrate 102, there are found mainly on the peripheries of the particles of gold (Au) unevennesses 106 having a roughness d as indicated in FIG. 2A. Therefore, the surface of the silicon substrate according to the present embodiment has a root-mean-square roughness (Rq) equal to 1.5 nm. FIG. 2C shows an observation, with use of an AFM (atomic force microscope) system (NanoScope IIIa manufactured by Veeco Instruments), of an image of the surface of the silicon substrate 102 according to the present embodiment on which gold (Au) as the first metal 104 is dispersed and allocated into the shapes of particles or islands. In this case, the surface roughness indicated above is of a degree to be visually recognized as a specular surface, and the surface of the silicon substrate is thus regarded as substantially flat. It is found by the above AFM system that the silicon substrate 102 prior to the dispersion/allocation of gold (Au) as the first metal 104, in other words, the initial silicon substrate 102, has a surface roughness of approximately 0.16 nm.

Figure 5:
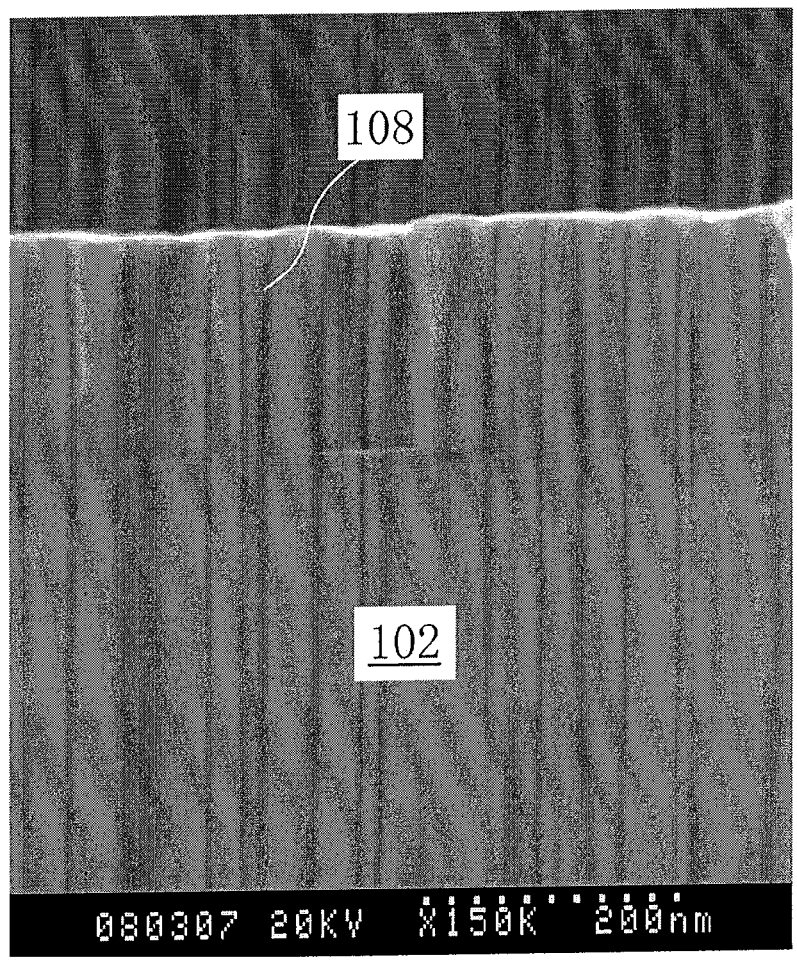
FIG. 5 is a cross sectional SEM picture showing a composite material according to the embodiment of the present invention.

Shortly after (within three hours, for example) the process with use of the first solution, as shown in FIG. 3, the above silicon substrate 102 having gold (Au) being dispersed and allocated into the shapes of particles or islands is immersed for 300 seconds in an electroless environment in a plating solution (hereinafter, also referred to as a second solution) 24 that is contained in a liquid tank 22 and is heated to 70° C. The second solution 24 in the present embodiment is an aqueous solution that includes a metal salt of nickel sulfate ($NiSO_4$) and a reducing agent of sodium phosphinate ($NaH_2PO_2$). FIG. 5 is a cross sectional SEM picture showing the surface of the silicon substrate 102 and the vicinity thereof after the immersion in the second solution 24 for about 300 seconds. As observed in FIG. 5, there is formed on the silicon substrate 102 a layer of a nickel-phosphorus alloy (Ni—P) as an alloy 108 of the second metal.

In the present embodiment, with gold (Au) as the first metal 104 dispersed and allocated into the shapes of particles or islands on the surface of the silicon substrate 102 serving as starting points, the nickel-phosphorus alloy (Ni—P) as the alloy 108 of the second metal is formed to cover the surface of the silicon substrate 102 by autocatalytic electroless plating. Accordingly, even after the initial catalytic agent of gold (Au) in the shapes of particles or islands is covered with the plating material of the nickel-phosphorus alloy (Ni—P), this nickel-phosphorus alloy (Ni—P) itself serves as a catalytic agent, thereby realizing continuous deposition of a nickel-phosphorus alloy (Ni—P). As a result, the surface of the silicon substrate 102 is covered with the nickel-phosphorus alloy (Ni—P).

As described above, by the adoption of autocatalytic electroless plating, the plating by the second metal or the alloy 108 of the second metal progresses with the first metal 104 serving as the starting points. Therefore, even in a case where there are the slight unevennesses as described above on the surface of the silicon layer, it is possible to obtain the composite material 100 provided with the layer of the second metal or the alloy 108 of the second metal with fewer voids being formed therebetween. That is, as the first metal 104 is tightly provided on the matrix, there are formed fewer voids between the matrix and the layer of the second metal or the alloy 108 of the second metal. In this case, the first metal 104 serving as the starting points is dispersed on the surface of the matrix preferably at a particle density from $3 \times 10^{10}$ particles/$cm^2$ to $1 \times 10^{13}$ particles/$cm^2$. In a case where the particle density of the starting points is less than $3 \times 10^{10}$ particles/$cm^2$, startability of the plating by autocatalytic electroless plating may be possibly deteriorated. On the other hand, in a case where the particle density of the starting points is more than $1 \times 10^{13}$ particles/$cm^2$, the adhesion of the second metal or an alloy of the second metal may be possibly deteriorated. These problems substantially apply also to the embodiments to be described later.

Subsequently measured was the adhesibility between the surface of the silicon substrate 102 and the layer of the nickel-phosphorus alloy (Ni—P) as the alloy 108 of the second metal, in the composite material 100 that was formed in the production method according to the present embodiment. Specifically, the adhesibility was measured with use of an adhesibility measurement device 40 shown in FIG. 14. The layer of the nickel-phosphorus alloy (Ni—P) was approximately 190 nm thick in the composite material 100 as the measurement target. This thickness of the layer was obtained in accordance with the gravimetric technique. The thickness of the layer of the second metal or the layer of an alloy of the second metal in each of the embodiments to be described later is obtained in the same manner.

Figure 14:
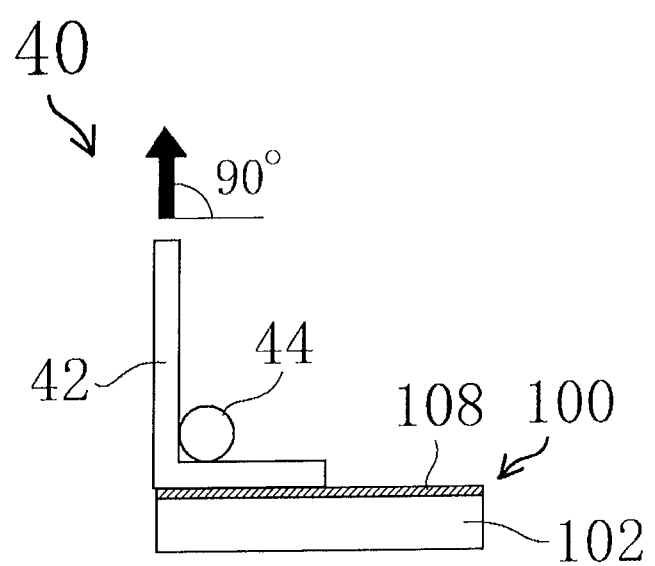
FIG. 14 is a schematic diagram of an adhesibility measurement device for a plating material according to an embodiment of the present invention.

The measurement was made in the following steps. Firstly, a highly adhesive tape (Model 859T manufactured by Sumitomo 3M Limited) 42 is partially attached onto the composite material 100. Subsequently, as shown in FIG. 14, one end of the tape 42 pressed by a presser 44 is caught by the adhesibility measurement device 40, and the tape 42 is then pulled at a constant velocity vertically upward with respect to the surface of the film of the alloy 108 of the second metal. The adhesibility was measured during the upward pulling operation by reading a force applied to the tape with use of a digital force gauge (DPS-5R manufactured by Imada Co., Ltd.).

It was found by the measurement that the adhesibility in the composite material 100 according to the present embodiment was higher than 1484 J/$m^2$. More specifically, the layer of the nickel-phosphorus alloy (Ni—P) was not detached from the silicon surface by the above adhesive tape. The composite material 100 of the present embodiment was therefore found to exert an extremely strong adhesibility.

It is noted that the surface roughness of the above silicon substrate 102 itself, on which gold (Au) is dispersed and allocated into the shapes of particles or islands, is considered to largely influence on the adhesion in the composite material 100. In spite of this assumption, there are still significant advantages that the composite material exerting high adhesion can be obtained even in a case where the matrix has a surface roughness to be substantially regarded as flat, as well as that the step of forming non-penetrating pores is not required, which had been already proposed by the inventors.

Moreover, all the steps shown in FIGS. 1 to 3 described above are performed in an electroless environment in the present embodiment. Therefore, the present embodiment is significantly advantageous also in view of cost therefor by applying plating of high mass productivity with use of the matrix of high versatility as well as by requiring no equipment such as electrodes, a power supply, and the like, which are essential in electroplating.

<Modification 1 to First Embodiment>

Figure 11:
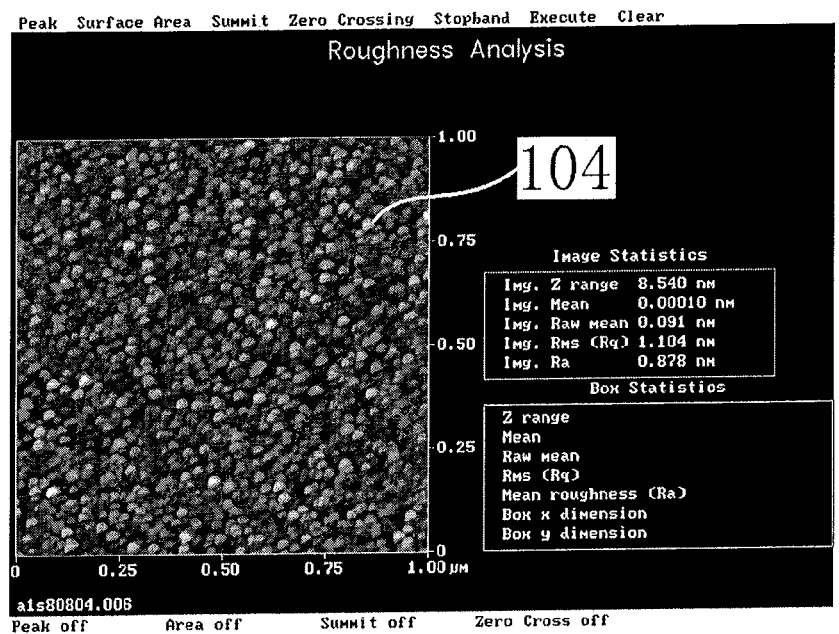
FIG. 11 is an AFM image showing a state where a first metal is dispersed and allocated into shapes of particles or islands on a single-crystalline silicon substrate according to a different embodiment of the present invention.

A composite material according to the present embodiment has the configuration same as that of the first embodiment except the facts that the silicon substrate 102 is immersed in the first solution 14 for one second and that the plating film is approximately 120 nm thick. Therefore, the description redundant with that of the first embodiment may not be repeatedly provided. FIG. 11 shows an observation, with use of the AFM (atomic force microscope) system (NanoScope IIIa manufactured by Veeco Instruments), of a state of the surface of the silicon substrate on which gold (Au) as the first metal 104 is dispersed and allocated.

In the composite material according to the present embodiment, the surface of the silicon substrate 102 had a root-mean-square roughness (Rq) of approximately 1.1 nm. Moreover, the adhesibility in the composite material according to the present embodiment was found to be higher than 1484 J/$m^2$. Therefore, even in such a case where the root-mean-square roughness (Rq) was only 1.1 nm, there was exerted an adhesibility substantially equal to that of the composite material 100 according to the first embodiment.

<Modification 2 to First Embodiment>

Figure 12:
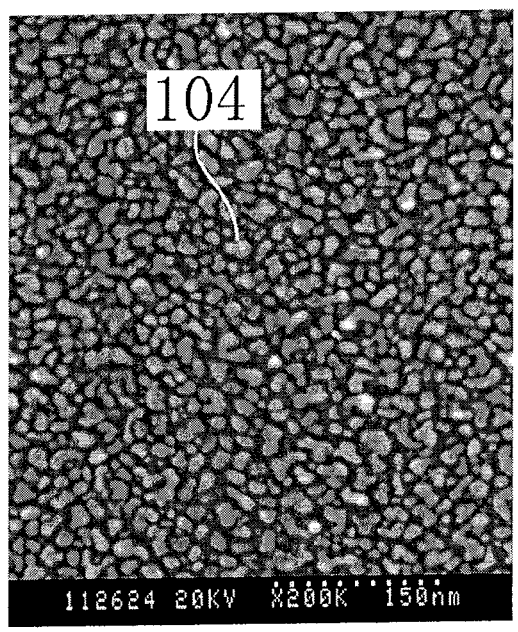
FIG. 12 is a SEM picture showing a state where a first metal is dispersed and allocated on a single-crystalline silicon substrate according to a different embodiment of the present invention.
Figure 13:
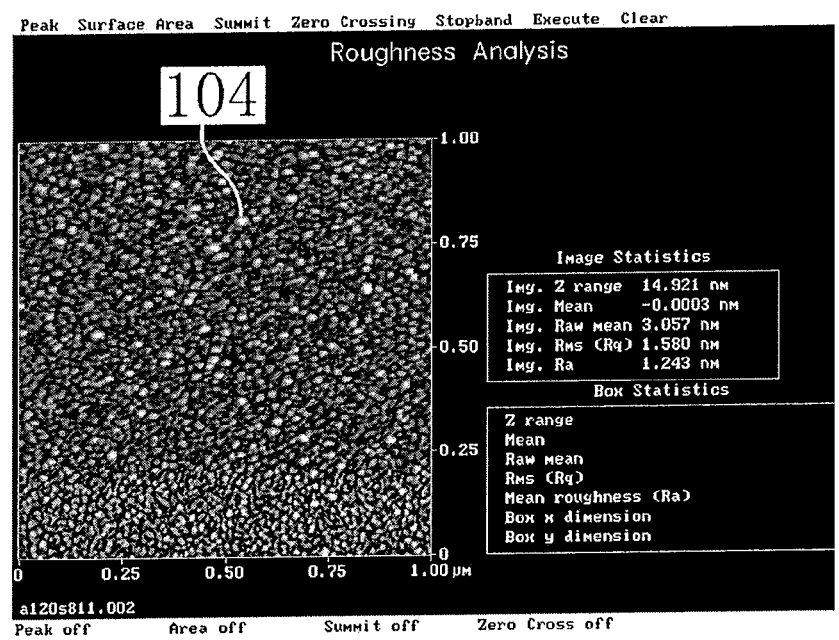
FIG. 13 is an AFM image showing a state where a first metal is dispersed and allocated into shapes of particles or islands on a single-crystalline silicon substrate according to a different embodiment of the present invention.

A composite material according to the present embodiment has the configuration same as that of the first embodiment except the facts that the silicon substrate 102 is immersed in the first solution 14 and in the second solution 24 for 120 seconds and that the plating film is approximately 100 nm thick. Therefore, the description redundant with that of the first embodiment may not be repeatedly provided. FIG. 12 is a SEM picture showing a state where the first metal 104 is dispersed and allocated on the surface of the silicon substrate 102. FIG. 13 shows an observation, with use of the AFM (atomic force microscope) system (NanoScope Ma manufactured by Veeco Instruments), of the state of the surface of the silicon substrate 102 on which gold (Au) as the first metal 104 is dispersed and allocated.

In the composite material according to the present embodiment, the surface of the silicon substrate 102 had a root-mean-square roughness (Rq) of approximately 1.6 nm. Moreover, the adhesibility in the composite material according to the present embodiment was found to be higher than 1484 J/m$^2$. Therefore, even in such a case where the plating film is 100 nm thick, which is regarded as quite thin, there was exerted an adhesibility substantially equal to that of the composite material 100 according to the first embodiment.

In consideration of the surface roughness of the initial silicon substrate 102, there will be exerted an adhesibility substantially equal to that of the composite material 100 according to the first embodiment in a case where the root-mean-square roughness (Rq) of the surface of the silicon substrate 102 having gold (Au) being dispersed and allocated is increased by an amount from 0.9 nm to 1.5 nm relative to the root-mean-square roughness (Rq) of the surface of the silicon substrate 102 prior to the dispersion/allocation of gold (Au) as the first metal 104. The first embodiment as well as the modifications thereto adopt the initial silicon substrate 102 having a surface roughness of approximately 0.16 nm. However, the effect obtained in the first embodiment is not limited by the surface roughness of the initial substrate. For example, there can be exerted an adhesibility substantially equal to that of the composite material 100 according to the first embodiment even in a case of adopting an initial silicon substrate of which surface has a root-mean-square roughness (Rq) of several hundred nanometers. As to be described later, this is supported by the fact that there is obtained a composite material exerting excellent adhesion even with use of a matrix having an uppermost layer of polycrystalline silicon or microcrystalline silicon.

<Comparative Example in First Embodiment>

Comparison was made between the adhesion in a composite material produced with a layer of a nickel-phosphorus alloy (Ni—P) as a plating material being formed in accordance with the "two-step catalyzation" technique, which is disclosed in Japanese Unexamined Patent Publication No. 2005-248287, and the adhesion in the composite material 100 produced in accordance with the first embodiment. The two-step catalyzation technique was adopted in the comparative example as pretreatments for plating, including immersion for 120 seconds in a sensitizing solution conditioned to room temperature and immersion for 60 seconds in an activating solution conditioned to room temperature. The plating bath was performed under the conditions same as the immersion in the second solution 24 in the first embodiment. The sensitizing solution includes 0.89 mM stannous chloride (SnCl$_2$) and 0.057 M hydrochloric acid (HCl). The activating solution includes palladium chloride (PdCl$_2$) and hydrochloric acid (HCl).

The layer of the nickel-phosphorus alloy (Ni—P) in the composite material produced in accordance with the two-step catalyzation technique was 220 nm thick, although the appearance thereof was worse than that of the composite material according to the first embodiment. Furthermore, when the adhesion was tested with use of a tape (Model CT-18 manufactured by Nichiban Co., Ltd.) which is less adhesive in comparison to the tape (Model 859T manufactured by Sumitomo 3M Limited) adopted in the first embodiment, detachment was observed in approximately a half (50%) of the plating layer. Consequently found is that the composite material produced with the layer of the nickel-phosphorus alloy (Ni—P) as the plating material being formed in accordance with the two-step catalyzation technique had regions of the adhesibilities of 426 J/m$^2$ or less.

<Second Embodiment>

A composite material 200 according to the present embodiment includes a silicon substrate 102 as a matrix and a layer of a cobalt-nickel-boron alloy (Co—Ni—B) as a plating material, which is formed on a surface of the silicon substrate 102. The method for producing the composite material 200 according to the present embodiment is the same as that of the first embodiment except for some conditions. Therefore, the description redundant with that of the first embodiment may not be repeatedly provided.

Again in the present embodiment, gold (Au) as a first metal was dispersed and allocated on the surface of the silicon substrate 102 with use of the dispersion/allocation device 10 configured as shown in FIG. 1. More specifically, similarly to the first embodiment, the present embodiment adopts as a first solution 14 an aqueous solution that is preliminarily conditioned to 5° C. and includes tetrachloroauric acid (HAuCl$_4$) of a molarity equal to 1 mmol/L (millimole/liter) and hydrofluoric acid (HF) of a molarity equal to 150 mmol/L. Moreover, again in the present embodiment, similarly to the first embodiment, there are observed mainly on the peripheries of the particles of gold (Au) unevennesses 106 having a roughness d as indicated in FIG. 2A. The surface of the silicon substrate 102 according to the present embodiment has a root-mean-square roughness (Rq) from 1.1 nm to 1.6 nm. The above surface roughness is of a degree to be visually recognized as a specular surface, and the surface of the silicon substrate is thus regarded as substantially flat.

Shortly after (within three hours, for example) the process with use of the first solution 14, as shown in FIG. 3, the above silicon substrate 102 having gold (Au) as the first metal 104 being dispersed and allocated into shapes of particles or islands is immersed for 300 seconds in an electroless environment in a plating solution (hereinafter, also referred to as a second solution) 24 that is contained in a liquid tank 22. The second solution 24 in the present embodiment is an aqueous solution that includes metal salts of cobalt sulfate (CoSO$_4$) and nickel sulfate (NiSO$_4$) as well as a reducing agent of dimethylamine-borane (DMAB). Through the above process, there is provided on the surface of the silicon substrate 102 a cobalt-nickel-boron alloy (Co—Ni—B) with substantially no voids being formed therebetween. In the present embodiment, there are included cobalt at approximately 90% in the percentage (% by weight), nickel at approximately 6% in the percentage (% by weight), and boron at approximately 4% in the percentage (% by weight).

Figure 6:
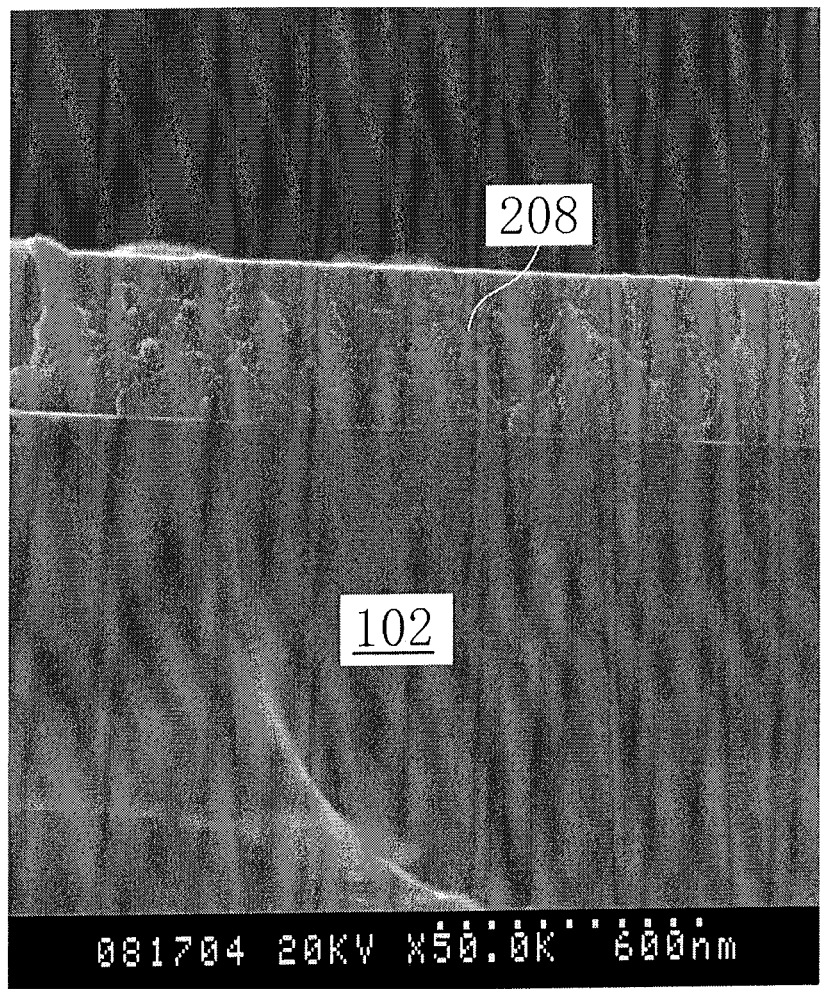
FIG. 6 is a cross sectional SEM picture showing a composite material according to a different embodiment of the present invention.

As described above, again in the present embodiment, with gold (Au) dispersed and allocated into the shapes of particles or islands serving as starting points, the cobalt-nickel-boron alloy (Co—Ni—B) as an alloy 208 of a second metal is formed to cover the surface of the silicon substrate 102 by autocatalytic electroless plating. Formed as a result is the layer of the cobalt-nickel-boron alloy (Co—Ni—B) as the alloy 208 of the second metal, which is highly adhesive to the surface of the silicon substrate 102. FIG. 6 is a cross sectional SEM picture showing the composite material 200 according to the present embodiment. Observed in FIG. 6 is the state where the silicon surface is covered with the layer of the cobalt-nickel-boron alloy (Co—Ni—B) as the alloy 208 of the second metal.

Measurement was made on the adhesibility between the surface of the silicon substrate 102 and the layer of the cobalt-nickel-boron alloy (Co—Ni—B) as the alloy 208 of the second metal, in the composite material 200 that was formed in the production method according to the present embodiment. Specifically, the adhesibility in the composite material 200 formed in the production method of the present embodiment was measured in the manner same as that of the first embodiment.

It was found by the measurement that the layer of the cobalt-nickel-boron alloy (Co—Ni—B) as the alloy 208 of the second metal was not detached in the composite material 200 according to the present embodiment. More specifically, the adhesibility of the layer of the cobalt-nickel-boron alloy (Co—Ni—B) as the alloy 208 of the second metal was higher than 1317 J/m$^2$ in this composite material 200. The composite material 200 of the present embodiment was therefore found to exert an extremely strong adhesibility. The reason why the composite material 200 in the present embodiment has the adhesibility of a value different from that of the first embodiment has not yet been found at the present stage. This difference in value may be possibly due to the difference of the materials for the alloys of the second metal as the plating films. Even if the composite material 200 has an adhesibility exceeding 1317 J/m$^2$, the composite material 200 is still recognized as a material of extremely high adhesion.

Furthermore, as in the first embodiment, all the steps described above are performed in an electroless environment in the present embodiment. Therefore, the present embodiment requires no equipment such as electrodes, a power supply, and the like, which are essential in electroplating. Since the first metal 104 in the shapes of particles or islands serves as starting points upon plating with use of the alloy 208 of the second metal by autocatalytic electroless plating, it is possible to form the layer on the surface of the silicon substrate 102 with fewer voids being formed therebetween, which may be provided due to the unevennesses of the surface of the silicon substrate 102.

<Comparative Example in Second Embodiment>

Again in the present embodiment, comparison was made between the adhesion in a composite material produced with a layer of a cobalt-nickel-boron alloy (Co—Ni—B) as a plating material being formed in accordance with the "two-step catalyzation" technique described above and the adhesion in the composite material 200 produced in accordance with the second embodiment. As a result, there occurred cracks and detachment in the plating material during formation of the plating layer, and it was therefore impossible even to form a uniform alloy of the second metal.

<Third Embodiment>

A composite material 300 according to the present embodiment includes a silicon substrate 102 as a matrix and a layer of a nickel-boron alloy (Ni—B) as a plating material, which is formed on a surface of the silicon substrate 102. The method for producing the composite material 300 according to the present embodiment is the same as that of the first embodiment except for some conditions. Therefore, the description redundant with that of the first embodiment may not be repeatedly provided.

Again in the present embodiment, there is used the dispersion/allocation device 10 configured as shown in FIG. 1. More specifically, similarly to the first embodiment, the present embodiment adopts as a first solution 14 an aqueous solution that is preliminarily conditioned to 5° C. and includes tetrachloroauric acid (HAuCl$_4$) of a molarity equal to 1 mmol/L (millimole/liter) and hydrofluoric acid (HF) of a molarity equal to 150 mmol/L. Moreover, again in the present embodiment, similarly to the first embodiment, there are found mainly on the peripheries of the particles of gold (Au) unevennesses 106 having a roughness d as indicated in FIG. 2A. The surface of the silicon substrate 102 according to the present embodiment has a root-mean-square roughness (Rq) from 1.1 nm to 1.6 nm. The above surface roughness is of a degree to be visually recognized as a specular surface, and the surface of the silicon substrate 102 is thus regarded as substantially flat.

Shortly after (within three hours, for example) the above process, as shown in FIG. 3, the silicon substrate 102 having gold (Au) as a first metal 104 being dispersed and allocated into shapes of particles or islands is immersed for about 180 seconds in a second solution 24 with use of the plating device 20 same as the device used in the first embodiment. The second solution 24 in the present embodiment is an aqueous solution that includes a metal salt of nickel sulfate (NiSO$_4$) and a reducing agent of dimethylamine-borane (DMAB).

Figure 7:
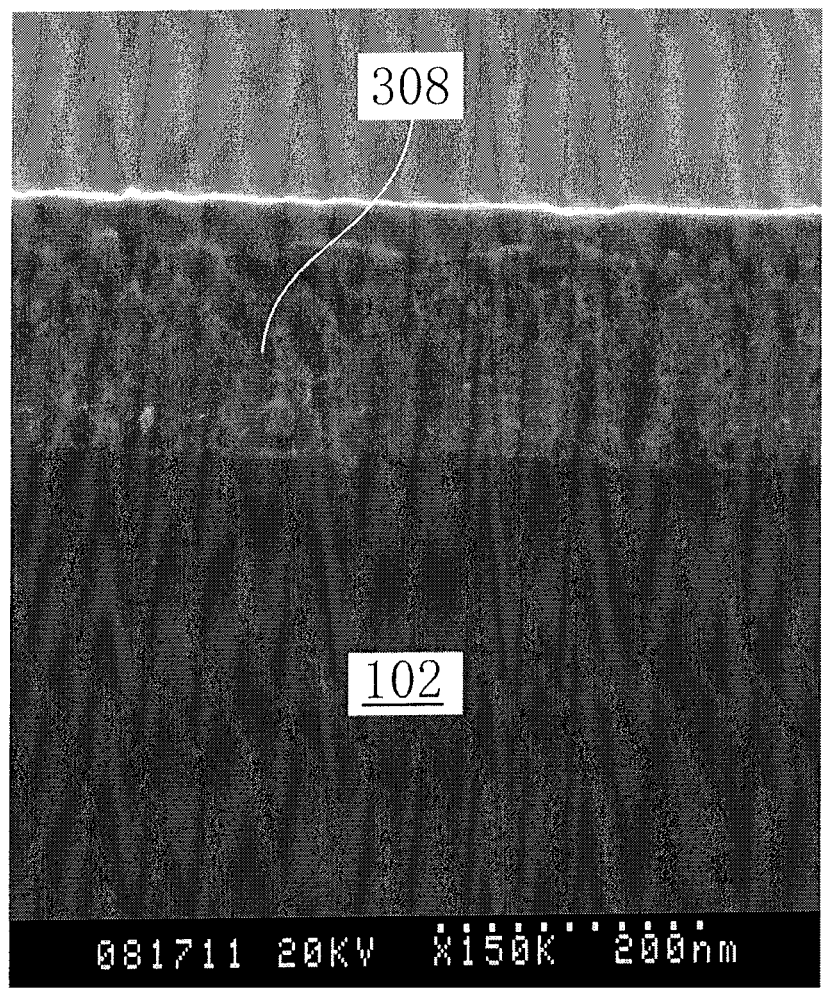
FIG. 7 is a cross sectional SEM picture showing a composite material according to a different embodiment of the present invention.

Through the production steps described above, with gold (Au) in the shapes of particles or islands serving as starting points, a nickel-boron alloy (Ni—B) as an alloy 308 of a second metal is formed to cover the surface of the silicon substrate 102 by autocatalytic electroless plating. Formed as a result is the layer of the nickel-boron alloy (Ni—B) as the alloy 308 of the second metal, which is highly adhesive to the surface of the silicon substrate 102. FIG. 7 is a cross sectional SEM picture showing the composite material 300 according to the present embodiment. Observed in FIG. 7 is the state where the silicon surface is covered with the layer of the nickel-boron alloy (Ni—B) as the alloy 308 of the second metal.

Then, measurement was made on the adhesibility between the surface of the silicon substrate 102 and the layer of the nickel-boron alloy (Ni—B) as the alloy 308 of the second metal, in the composite material 300 that was formed in the production method according to the present embodiment. Specifically, the qualitative adhesion was tested on the composite material 300 according to the present embodiment in compliance with JIS H8504 methods of adhesion test for metallic coatings. Attached onto the composite material 300 was a highly adhesive tape (Model 859T manufactured by Sumitomo 3M Limited) in place of the JIS Z1522 adhesive cellophane tape (equivalent to the tape (Model CT-18) manufactured by Nichiban Co., Ltd.).

It was found by the test that no detachment occurred in the composite material 300 according to the present embodiment. Thus, the adhesibility of the layer of the nickel-boron alloy (Ni—B) was higher than 1317 J/m$^2$ in the composite material 300 according to the present embodiment. The composite material 300 of the present embodiment was therefore found to exert an extremely strong adhesibility.

<Comparative Example in Third Embodiment>

Again in the present embodiment, comparison was made between the adhesion in a composite material produced with a layer of a nickel-boron alloy (Ni—B) as a plating material being formed in accordance with the "two-step catalyzation" technique described above and the adhesion in the composite material 300 produced in accordance with the third embodiment. As a result, there occurred cracks and detachment of the plating material during formation of the plating layer, and it was therefore impossible even to form a uniform alloy of the second metal.

The embodiments described above respectively adopt, as an alloy of the second metal, the nickel-phosphorus alloy (Ni—P), the nickel-boron alloy (Ni—B), and the cobalt-nickel-boron alloy (Co—Ni—B). However, the present invention is not limited to such cases. For example, it is possible to adopt, as a plating material, a cobalt-phosphorus alloy (Co—P), a cobalt-boron alloy (Co—B), a nickel-phosphorus alloy (Ni—P), nickel (Ni), cobalt (Co), or copper (Cu).

For example, in a case where adopted as the second solution 24 is an aqueous solution that includes a metal salt of cobalt sulfate (CoSO$_4$) and a reducing agent of dimethylamine-borane (DMAB), cobalt (Co) is provided substantially as the second metal so as to cover the surface of the silicon substrate 102. In this case, although the plating material is substantially regarded as cobalt (Co), to be extremely precise, the plating material can be recognized as a cobalt-boron alloy (Co—B) that includes boron at approximately 0% to 0.2% in the atomic percentage (atom %).

Therefore, similarly to the respective embodiments already described, the layer of an arbitrary kind of second metal or an alloy of the second metal is formed to cover the surface of the silicon substrate by autocatalytic plating.

<Example>

Table 1 shows examples of measurement results on the adhesion in composite materials that are formed by combinations of the first metals and the plating materials (namely, the second metals or alloys of the second metals) in accordance with the above respective embodiments as well as described above. In Table 1, the adhesibility measurement device 40 already described was used to measure the adhesion in each of the composite materials provided with the nickel-phosphorus alloy (Ni—P), the nickel-boron alloy (Ni—B), and the cobalt-nickel-boron alloy (Co—Ni—B), while each of the remaining composite materials provided with a plating material other than those listed above was measured in compliance with JIS H8504 methods of adhesion test for metallic coatings.

Further, the row W in Table 1 includes the measurement results each made by the adhesibility measurement device 40 described above with use of the JIS Z1522 adhesive cellophane tape (equivalent to the tape (Model CT-18) manufactured by Nichiban Co., Ltd.), which has an adhesibility equal to 426 J/m$^2$ with respect to a plating material. The row M includes the measurement results each made with use of a tape A (Model 3305) manufactured by Sumitomo 3M Limited, which has an adhesibility equal to 768 J/m$^2$. The row S includes the measurement results each made with use of a tape B (Model 859T) manufactured by Sumitomo 3M Limited, which has an adhesibility equal to 1317 J/m$^2$ or 1484 J/m$^2$. In the table, the symbols ○ each indicate that the plating material was not detached in the composite material with use of the adopted tape, while the symbols X each indicate that detachment occurred between the matrix and the plating material in the composite material with use of the adopted tape.

TABLE 1

| Second metal or alloy thereof | Type of tape | | |
|---|---|---|---|
| | W | M | S |
| Co—P | ○ | ○ | ○ |
| Co—Ni—P | ○ | x | x |
| Co—Ni—B | ○ | ○ | ○ |
| Ni—P | ○ | ○ | ○ |
| Ni—B | ○ | ○ | ○ |

As indicated in Table 1, in all the composite materials other than that adopts the cobalt-nickel-phosphorus alloy (Co—Ni—P) as the plating material, the adhesibilities thereof were found to be high enough to exceed 1317 J/m$^2$ or 1484 J/m$^2$. Even in the case of the cobalt-nickel-phosphorus alloy (Co—Ni—P), the adhesibility was found to be at least higher than 426 J/m$^2$. Therefore, each of the composite materials provided with any one of the plating materials listed in Table 1 exerts significantly high adhesion.

Each of the embodiments described above adopts the single-crystalline silicon substrate as the matrix. However, the present invention is not limited to such a case. More specifically, the target of dispersion/allocation of gold (Au) into the shapes of particles or islands is not limited to a silicon substrate. The base material for the matrix is not particularly limited as far as the matrix is provided with an uppermost layer of single-crystalline silicon, polycrystalline silicon, microcrystalline silicon, or amorphous silicon. More specifically, if there is provided an uppermost layer that is basically made of at least a material selected from a group consisting of single-crystalline silicon, polycrystalline silicon, microcrystalline silicon, and amorphous silicon, there is exerted an effect similar to that of the present invention.

<Fourth Embodiment>

Described in the present embodiment are a different composite material 400 as well as a method for producing the same. The method for producing the composite material 400 according to the present embodiment is the same as that of the first embodiment except for a matrix thereof. Therefore, the description redundant with that of the first embodiment may not be repeatedly provided.

The present embodiment adopts a polycrystalline silicon substrate as a matrix 402. Again in the present embodiment, gold (Au) as a first metal 404 was dispersed and allocated on a surface of the matrix 402 with use of the dispersion/allocation device 10 configured as shown in FIG. 1. More specifically, similarly to the first embodiment, the matrix 402 is immersed for 10 seconds in a first solution 14 that is contained in a liquid tank 12 and is preliminarily conditioned to 5° C. The first solution 14 includes tetrachloroauric acid (HAuCl$_4$) of a molarity equal to 1 mmol/L (millimole/liter) and hydrofluoric acid (HF) of a molarity equal to 150 mmol/L. The polycrystalline silicon substrate in the present embodiment is of an n-type.

Figure 8:
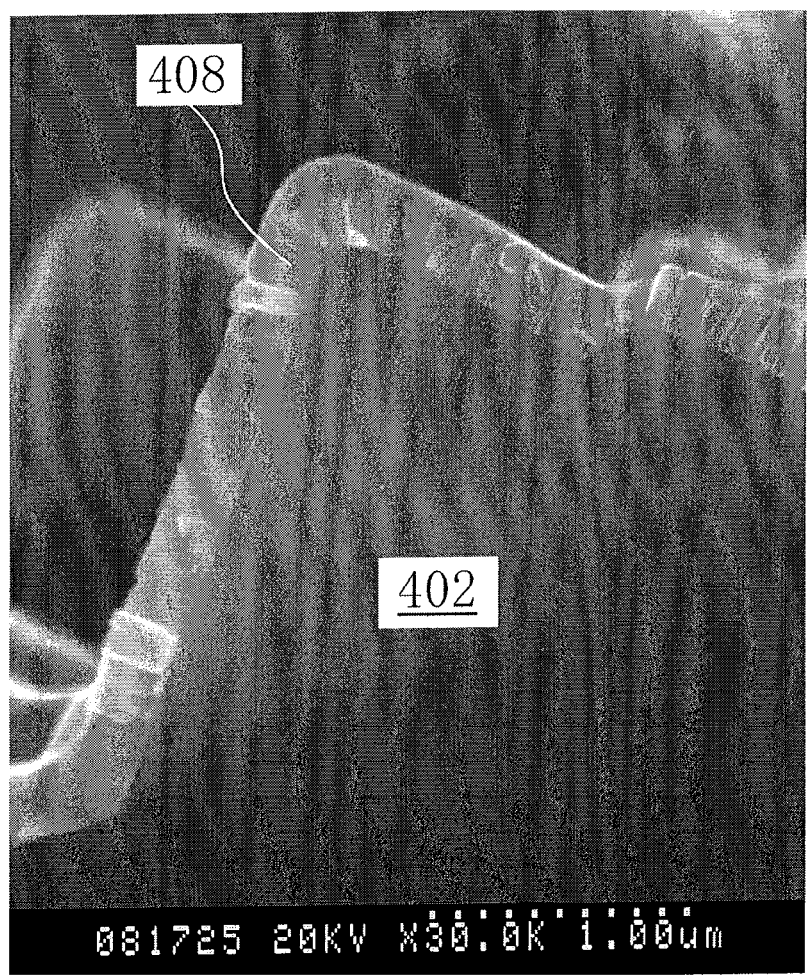
FIG. 8 is a cross sectional SEM picture showing a composite material according to a different embodiment of the present invention.

Shortly after (within three hours, for example) the process with use of the first solution 14, as shown in FIG. 3, the above matrix 402 having gold (Au) being dispersed and allocated into shapes of particles or islands is immersed for about 300 seconds in an electroless environment in a plating solution (hereinafter, also referred to as a second solution) 24 that is contained in a liquid tank 22. The second solution 24 in the present embodiment is an aqueous solution that includes a metal salt of nickel sulfate (NiSO$_4$) and a reducing agent of sodium phosphinate (NaH$_2$PO$_2$). FIG. 8 is a cross sectional SEM picture showing the surface of the matrix 402 and the vicinity thereof after the immersion in the second solution 24 for about 300 seconds. As observed in FIG. 8, the matrix 402 is provided thereon with a layer of a nickel-phosphorus alloy (Ni—P) as an alloy 408 of a second metal.

In the present embodiment, with gold (Au) as the first metal 404 dispersed and allocated into the shapes of particles or islands on the surface of the matrix 402 serving as starting points, the layer of the nickel-phosphorus alloy (Ni—P) as the alloy 408 of the second metal is formed to cover the surface of the matrix 402 by autocatalytic electroless plating. Accordingly, even after the initial catalytic agent of gold (Au) in the shapes of particles or islands is covered with the layer of the nickel-phosphorus alloy (Ni—P) as the plating material, this layer itself serves as a catalytic agent, thereby realizing continuous deposition of a layer of a nickel-phosphorus alloy (Ni—P). As a result, the surface of the matrix 402 is covered with the layer of the nickel-phosphorus alloy (Ni—P).

As described above, by the adoption of autocatalytic electroless plating, the plating by the second metal or the alloy 408 of the second metal progresses with the first metal serving as the starting points. Therefore, even in a case where there are relatively large unevennesses on the surface of the matrix 402 made of polycrystalline silicon, it is possible to obtain the composite material 400 provided with the layer of the second metal or the alloy 408 of the second metal with fewer voids being formed therebetween.

Subsequently measured was the adhesibility between the surface of the matrix 402 and the layer of the nickel-phosphorus alloy (Ni—P) as the second metal 408, in the composite material 400 that was formed in the production method according to the present embodiment. Specifically, the adhesibility was measured with use of the adhesibility measurement device 40 same as that used in the first embodiment. The layer of the nickel-phosphorus alloy (Ni—P) was approximately 280 nm thick in the composite material 400.

In the measurement, before the detachment of the layer of the nickel-phosphorus alloy (Ni—P) was observed in the composite material 400 according to the present embodiment, the polycrystalline silicon substrate as the matrix 402 was fractured or cracked. Thus, the adhesibility of the layer of the nickel-phosphorus alloy (Ni—P) in the composite material 400 according to the present embodiment was higher than 707 J/m$^2$, which is the measurement value upon fracture or crack of the matrix 402. The composite material 400 of the present embodiment was therefore found to exert an extremely strong adhesibility.

<Comparative Example in Fourth Embodiment>

Again in the present embodiment, comparison was made between the adhesion in a composite material produced with a layer of a nickel-phosphorus alloy (Ni—P) as a plating material being formed in accordance with the "two-step catalyzation" technique described above and the adhesion in the composite material 400 produced in accordance with the fourth embodiment.

The adhesion of the layer of the nickel-phosphorus alloy (Ni—P) having a thickness of approximately 300 nm in the composite material produced in accordance with the "two-step catalyzation" technique was measured with use of a less adhesive tape (Model CT-18 manufactured by Nichiban Co., Ltd.). In the measurement, detachment occurred in most (90%) of the plating layer. Further, the adhesibility in the composite material was measured by the adhesibility measurement device 40 shown in FIG. 14 with use of another test piece of the same quality produced in accordance with the "two-step catalyzation" technique. In the measurement, complete detachment was observed at the interface between the alloy 408 of the second metal as the plating layer and the matrix 402, in which case the maximum adhesibility was 300 J/m$^2$. Accordingly, the adhesibility was found to be at most 300 J/m$^2$ in the composite material produced with the layer of the nickel-phosphorus alloy (Ni—P) as the plating material being formed in accordance with the "two-step catalyzation" technique.

The present embodiment adopts the nickel-phosphorus alloy (Ni—P) as the alloy 408 of the second metal. However, the present invention is not limited to such a case. It is possible to obtain a composite material of a high adhesibility provided with a layer of the second metal or an alloy of the second metal described in any one of the first to fourth embodiments or listed in Table 1 by appropriately selecting a metal salt and a reducing agent in the second solution 24. Moreover, although the polycrystalline silicon substrate is adopted in the present embodiment, the present invention is not limited thereto. For example, even in a case of adopting a matrix including a substrate of which a base has a silicon oxide and a polycrystalline silicon layer formed on a surface of the silicon oxide in accordance with a known CVD method, there can be exerted a high adhesibility between the polycrystalline silicon layer and the layer of the second metal or an alloy of the second metal. Furthermore, there is exerted an effect substantially the same as that of the present embodiment even in a case where the polycrystalline silicon layer is of a p-type.

Again in the present embodiment, all the steps shown in FIGS. 1 to 3 described above are performed in an electroless environment. Therefore, the present embodiment is significantly advantageous also in view of cost therefor by applying plating of high mass productivity with use of the matrix including polycrystalline silicon of high versatility as well as by requiring no equipment such as electrodes, a power supply, and the like, which are essential in electroplating.

<Fifth Embodiment>

Described in the present embodiment are a different composite material 500 as well as a method for producing the same. The method for producing the composite material 500 according to the present embodiment is the same as that of the first embodiment except for a matrix thereof. Therefore, the description redundant with that of the first embodiment may not be repeatedly provided.

A matrix 502 according to the present embodiment adopts a glassy carbon as a base which is provided on a surface thereof with hydrogenated microcrystalline silicon layers (lamination of an n-type microcrystalline silicon carbide (SiC) layer of 25 nm thick and an i-type microcrystalline silicon layer of 2 to 3 µm thick). Again in the present embodiment, a first metal 504 of gold (Au) was dispersed and allocated on the surface of the matrix 502 with use of the dispersion/allocation device 10 configured as shown in FIG. 1. More specifically, similarly to the first embodiment, the matrix is immersed for 10 seconds in a first solution 14 that is contained in a liquid tank 12 and is preliminarily conditioned to 5° C. The first solution 14 includes tetrachloroauric acid (HAuCl$_4$) of a molarity equal to 1 mmol/L (millimole/liter) and hydrofluoric acid (HF) of a molarity equal to 150 mmol/L.

Figure 9:
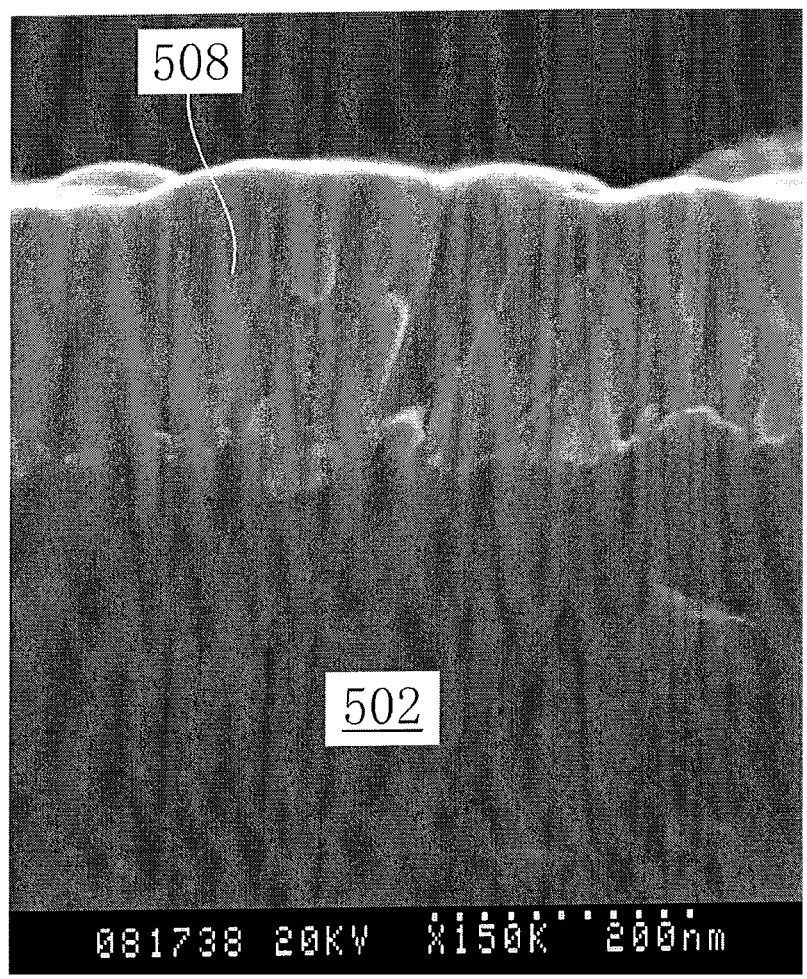
FIG. 9 is a cross sectional SEM picture showing a composite material according to a different embodiment of the present invention.

Shortly after (within three hours, for example) the process with use of the first solution 14, as shown in FIG. 3, the above matrix 502 having gold (Au) being dispersed and allocated into shapes of particles or islands is immersed for about 300 seconds in an electroless environment in a plating solution (hereinafter, also referred to as a second solution) that is contained in a liquid tank 22. The second solution 24 in the present embodiment is an aqueous solution that includes a metal salt of nickel sulfate (NiSO$_4$) and a reducing agent of sodium phosphinate (NaH$_2$PO$_2$). FIG. 9 is a cross sectional SEM picture showing the surface of the matrix 502 and the vicinity thereof after the immersion in the second solution 24 for about 300 seconds. As observed in FIG. 9, the matrix 502 is provided thereon with a layer of a nickel-phosphorus alloy (Ni—P) as an alloy 508 of a second metal.

In the present embodiment, with gold (Au) as the first metal 504 dispersed and allocated into the shapes of particles or islands on the surface of the matrix 502 serving as starting points, the layer of the nickel-phosphorus alloy (Ni—P) as the alloy 508 of the second metal is formed to cover the surface of the matrix 502 by autocatalytic electroless plating. Accordingly, even after the initial catalytic agent of gold (Au) in the shapes of particles or islands is covered with the layer of the nickel-phosphorus alloy (Ni—P) as the plating material, this layer itself serves as a catalytic agent, thereby realizing continuous deposition of a layer of a nickel-phosphorus alloy (Ni—P). As a result, the surface of the matrix 502 is covered with the layer of the nickel-phosphorus alloy (Ni—P).

Figure 10:
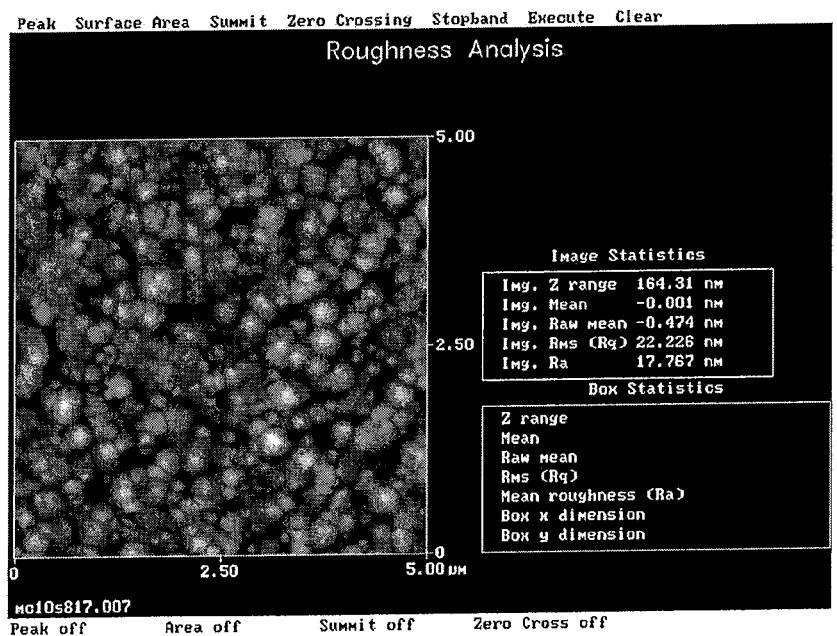
FIG. 10 is an AFM image showing a state where a first metal is dispersed and allocated into shapes of particles or islands on a microcrystalline silicon substrate according to a different embodiment of the present invention.

As described above, by the adoption of autocatalytic electroless plating, the plating by the second metal or the alloy 508 of the second metal progresses with the first metal 504 serving as the starting points. Therefore, even in a case where there are relatively large unevennesses on the surface of the matrix made of microcrystalline silicon or the like, it is possible to obtain the composite material 500 provided with the layer of the second metal or the alloy 508 of the second metal with fewer voids being formed therebetween. FIG. 10 is an AFM image showing the state where the first metal 504 is dispersed and allocated into the shapes of particles or islands on the microcrystalline silicon layer according to the present embodiment. The first metal 504 is not particularly indicated in FIG. 10 as it is difficult to specify the positions of the first metal 504 due to the relatively large surface roughness of the matrix 502. As indicated in FIG. 10, the surface of the microcrystalline silicon layer having the first metal 504 being dispersed and allocated thereon has a root-mean-square roughness (Rq) of approximately 22.2 nm, which is about 140 times of that of the silicon substrate 102 according to the first embodiment.

Subsequently measured was the adhesibility between the surface of the matrix 502 and the layer of the nickel-phosphorus alloy (Ni—P) as the second metal 508, in the composite material 500 that was formed in the production method according to the present embodiment. Specifically, the qualitative adhesion was tested on the composite material 500 according to the present embodiment in compliance with JIS H8504 methods of adhesion test for metallic coatings. Attached onto the composite material 500 was a highly adhesive tape (Model 859T manufactured by Sumitomo 3M Limited) in place of the JIS Z1522 adhesive cellophane tape (equivalent to the tape (Model CT-18) manufactured by Nichiban Co., Ltd.). The thickness of the layer of the nickel-phosphorus alloy (Ni—P) was approximately 180 nm thick in the composite material 500.

In this test, no detachment was observed in the composite material 500 according to the present embodiment. It was therefore found that the adhesibility of the layer of the nickel-phosphorus alloy (Ni—P) was higher than 1484 J/m$^2$ in the composite material 500 according to the present embodiment. In other words, the composite material 500 of the present embodiment was found to exert an extremely strong adhesibility.

The present embodiment adopts the nickel-phosphorus alloy (Ni—P) as the second metal 508. However, the present invention is not limited to such a case. It is possible to obtain a composite material of a high adhesibility provided with a layer of the second metal or an alloy of the second metal described in any one of the first to fourth embodiments or listed in Table 1 by appropriately selecting a metal salt and a reducing agent in the second solution 24. Moreover, although adopted in the present embodiment is the matrix including the glassy carbon as the base which is provided on the surface thereof with hydrogenated microcrystalline silicon layers, the present invention is not limited thereto. For example, it is possible to exert a high adhesibility between a layer of the second metal or an alloy of the second metal and a microcrystalline silicon layer, which is formed on a glass base or on a transparent conductive film provided on a glass material as a base.

Again in the present embodiment, all the steps shown in FIGS. 1 to 3 described above are performed in an electroless environment. Therefore, the present embodiment is significantly advantageous also in view of cost therefor by applying plating of high mass productivity with use of the matrix including microcrystalline silicon of high versatility as well as by requiring no equipment such as electrodes, a power supply, and the like, which are essential in electroplating.

Each of the embodiments described above adopts the first solution including hydrofluoric acid. However, the present invention is not limited to such a case. An effect substantially the same as that of the present invention is exerted even in a case where ammonium fluoride (NH$_4$F) is used in place of hydrofluoric acid, for example. In other words, it is possible to exert an effect substantially the same as that of the present invention by adopting a solution including fluoride ions.

Although not noted in the above description of the respective embodiments, the layer of the second metal or an alloy of the second metal may include, in addition to the second metal or the alloy of the second metal, an impurity, though slightly, such as carbon (C), oxygen (O), hydrogen (H), an additive like formalin or saccharin, which is included in a plating bath, or a decomposition product of any one of the substances described above. As described so far, the scope of claims also covers modifications made within the scope of the present invention, inclusive of other combinations of the respective embodiments.

INDUSTRIAL APPLICABILITY

The present invention is widely applicable as a technical element for a functional composite material.

The invention claimed is:
1. A composite material comprising:
a matrix having a silicon layer as an uppermost layer;
gold particles on a surface of the matrix in shapes of particles or islands, the gold particles displacing part of the silicon layer; and
a metal or an alloy of the metal covering the surface of the matrix, the metal or the alloy of the metal being formed by autocatalytic electroless plating and adhering to the surface with an adhesibility such that the metal or alloy thereof cannot be detached from the surface when tested according to Japanese Industrial Standard test H8504, wherein the gold particles serve as starting points for the autocatalytic electroless plating and wherein the gold particles are catalytically active with respect to a reducing agent employed for the autocatalytic electroless plating.

2. The composite material according to claim 1, wherein the gold particles are dispersed on the surface of the matrix at a particle density ranging from $3\times10^{10}$ particles/cm$^2$ to $1\times10^{13}$ particles/cm$^2$.

3. The composite material according to claim 1, wherein the silicon layer comprises single-crystalline silicon, and the surface of the matrix comprising the gold particles has a root-mean-square roughness (Rq) ranging from 1.1 nm to 1.6 nm.

4. The composite material according to claim 1, wherein the silicon layer comprises a material selected from the group consisting of single-crystalline silicon, polycrystalline silicon, microcrystalline silicon and amorphous silicon.

5. The composite material according to claim 1, wherein the root-mean-square roughness (Rq) of the surface of the matrix comprising the gold particles is increased by an amount ranging from 0.9 nm to 1.5 nm relative to a root-mean-square roughness (Rq) of the surface of the matrix in the absence of the gold particles.

6. A composite material comprising:
a matrix having a silicon layer as an uppermost layer;
gold particles on a surface of the matrix in shapes of particles or islands, the gold particles displacing part of the silicon layer; and
a metal or an alloy of the metal covering the surface of the matrix and adhering to the surface with an adhesibility such that the metal or alloy thereof cannot be detached from the surface when tested according to Japanese Industrial Standard test H8504.

7. The composite material according to claim 6, wherein the gold particles are dispersed on the surface of the matrix at a particle density ranging from $3\times10^{10}$ particles/cm$^2$ to $1\times10^{13}$ particles/cm$^2$.

8. The composite material according to claim 6, wherein the silicon layer comprises single-crystalline silicon, and the surface of the matrix comprising the gold particles has a root-mean-square roughness (Rq) ranging from 1.1 nm to 1.6 nm.

9. The composite material according to claim 6, wherein the silicon layer comprises a material selected from the group consisting of single-crystalline silicon, polycrystalline silicon, microcrystalline silicon and amorphous silicon.

10. The composite material according to claim 6, wherein the root-mean-square roughness (Rq) of the surface of the matrix comprising the gold particles is increased by an amount ranging from 0.9 nm to 1.5 nm relative to a root-mean-square roughness (Rq) of the surface of the matrix in the absence of the gold particles.

* * * * *